United States Patent [19]

Kaneki et al.

[11] Patent Number: 4,556,608
[45] Date of Patent: Dec. 3, 1985

[54] PHOTOMASK BLANK AND PHOTOMASK

[75] Inventors: Satoru Kaneki, Sayama; Kazuhiro Tabuchi, Tsurugashima, both of Japan

[73] Assignee: Dai Nippon Insatsu Kabushiki Kaisha, Tokyo, Japan

[21] Appl. No.: 565,611

[22] Filed: Dec. 27, 1983

Related U.S. Application Data

[63] Continuation-in-part of Ser. No. 306,377, Sep. 28, 1981, abandoned.

[30] Foreign Application Priority Data

Oct. 9, 1980 [JP] Japan ............................ 55-141565

[51] Int. Cl.$^4$ ...................... B32B 9/00; H01L 21/302
[52] U.S. Cl. .................................. 428/629; 428/664; 428/666; 428/667; 428/632; 428/633
[58] Field of Search ............... 428/629, 664, 666, 667, 428/632, 633

[56] References Cited

U.S. PATENT DOCUMENTS

| | | | |
|---|---|---|---|
| 3,443,915 | 5/1969 | Wood et al. ............................ | 430/5 |
| 4,342,817 | 8/1982 | Bohlen et al. ......................... | 428/596 |
| 4,374,912 | 2/1983 | Kaneki et al. ......................... | 428/469 |

FOREIGN PATENT DOCUMENTS

| | | | |
|---|---|---|---|
| 53-40281 | 4/1978 | Japan ..................................... | 430/5 |
| 54-51832 | 4/1979 | Japan ..................................... | 430/5 |
| 55-79447 | 6/1980 | Japan ..................................... | 430/5 |

Primary Examiner—Veronica O'Keefe
Attorney, Agent, or Firm—Parkhurst & Oliff

[57] ABSTRACT

A photomask is fabricated by forming, in a photomask (hard mask) produced by forming a patternized film of a masking material comprising (a) a layer of metallic chromium and (b) a layer of chromium oxides superposed thereon, a film of a translucent and electroconductive material selected from Nb, Ta and V, between the masking film and the transparent substrate. At the time of pattern transferring by photolithography, dropping off of parts of the pattern of this photomask does not occur even when it includes isolated island-like parts, and, at the time of inspection by electron-beam exposure, the precision of inspection does not lower. This photomask is obtained by patternizing by selective etching the masking film of a photomask blank produced by successively forming, on the transparent substrate, the translucent and electroconductive film and the masking film.

6 Claims, 6 Drawing Figures

PHOTOMASK BLANK AND PHOTOMASK

CROSS-REFERENCE TO RELATED APPLICATIONS

This is a continuation-in-part of application Ser. No. 306,377 filed Sept. 28, 1981, now abandoned.

BACKGROUND OF THE INVENTION

This invention relates generally to photomask blanks and photomasks for use in the production of semiconductors, integrated circuits (IC), large-scale integrated circuits (LSI), and similar electronic components. More specifically, this invention relates to photomasks of the type generally called hard masks and to their blanks.

In general, a photomask blank is fabricated by forming on an outer surface of a transparent substrate a thin metal film or, in place thereof, a thin film of a masking material by a process such as vapor deposition or sputtering. By applying a photolithographic process including the steps of forming a photoresist film, pattern exposure to light, and etching to this photomask blank, a thin film of the above mentioned metal or masking material is left in the form of a pattern such as a pattern of a circuit for an IC or an LSI on the transparent substrate thereby to produce a photomask.

This photomask is superposed on a semiconductor wafer and thus used for pattern transfer exposure, but since the photomask is actually an expendable article, the common practice at present is to fabricate beforehand a master mask or, further, a sub-master mask and, with the use of this master mask or sub-master mask, to fabricate masks for transferring patterns onto semiconductor wafers. For reasons of cost, photomasks having a silver emulsion film as a light-screening film are frequently used as photomasks for pattern transfer.

A circuit pattern on the above mentioned hard mask comprises a film of a material such as metallic chromium or a chromium oxide in scattered state on a glass plate. This film is not necessarily continuous over its entire expanse, there being parts existing in isolated island-like state on the glass plate. A problem arises in the following two cases as described below. The first case is that wherein this hard mask is used as a master mask or a sub-master mask and caused to contact a blank for a mask having a silver emulsion film, onto which the circuit pattern of the master mask is transferred. The second case is that wherein the circuit pattern of a mask is caused to contact a semiconductor wafer which has been coated with a resist thereby to transfer the circuit pattern.

In each of these cases, static electricity is generated by friction at the time of intimate contact and peeling off, and a discharge phenomenon occurs between the pattern parts of the hard mask. Consequently, particularly at the peripheral parts of the film comprising metallic chromium, a chromium oxide, or the like of the above mentioned island-like parts of the pattern, portions of the film are observed to have dropped off and are missing. Even small portions which are thus missing give rise to a complete loss of the function of the master mask, whereby this result is a fatal defect.

Furthermore, photomasks known in the prior art have exposed portions of the substrate outer surface. These exposed portions have lower surface strength than thin film portions and are subject to so-called staining during storage. Portions in which staining has occurred are easily damaged, in general, and lead to a lowering of the resolution of the mask.

Another problem is that, when the photomask is brought into intimate contact with a semiconductor wafer for exposure to light, the portions in which staining has occurred are very easily scratched or scored by the concavities and convexities of the semiconductor surface, dust, and other causes. Consequently, in spite of the use of the thin film of metallic chromium, chromium oxide, or the like for the light-screening film especially for their high value of surface hardness, the strength and durability of the entire hard mask is determined by those of the transparent substrate.

Still another difficulty is that, because of the accumulation of electrostatic charge during use as a result of repeated use, dust readily adheres to give rise to problems such as impairment of the intimate contact with the wafer and scratching of surfaces due to the dust.

Furthermore, together with miniaturization and denser arrangement of semiconductor devices, extremely high degrees of image quality and dimensional precision of the photomasks therefor become necessary. For this reason, in place of the ordinary photographic inspection, the electron beam inspection is coming into use. However, since photomasks after patterning are generally insulative along the expanse thereof, the parts irradiated by electron beam are charged and the accuracy of inspection is lowered to an impractical level.

In order to avoid the above difficulties, it has been proposed to use a photomask wherein an electroconductive film made of an oxide such as indium oxide and tin oxide is interposed between a transparent substrate and a masking film (U.S. Pat. No. 4,178,403). According to this mask, the above mentioned difficulties resulting from the insulative property of photomasks can be obviated. However, electroconductive photomasks of this type accompany the following other difficulties and are not practically satisfactory.

Firstly, the oxide electroconductive films as mentioned above do not have a sufficient chemical resistance and are readily attacked by a chromic acid mixture solution, a mixture solution of $H_2SO_4+H_2O_2$ and a mixture solution of benzenesulfonic acid and a phenol which are generally used as cleaning solutions for photomasks, whereby not only the transparency of parts not covered by the masking film is considerably changed but also the oxide electroconductive films are caused to dissolve in a relatively short time and lose their conductivity. These oxide films, of course, have a sufficient resistance to organic solvent, whereas it is, as is well-known in the art, extremely difficult to remove various kinds of stains adhering to photomasks with organic solvent.

Secondly, these electroconductive oxide films have poor adhesiveness or stickiness to both glass substrates and masking films such as chromium films and are liable to form defects such as pin-holes. Furthermore, for the same reason, they generally have a poor scratch-resistance.

Because of these difficulties, this type of photomask having an oxide electro-conductive film generally fails to give an improved durability which hard masks are expected to provide.

SUMMARY OF THE INVENTION

It is an object of this invention to overcome the problems encountered with respect to known hard masks as described above and thereby to provide photomask blanks and photomasks having high durability and, moreover, excellent applicability to the electron-beam inspection.

This invention contemplates the achievement of the above stated object by a multilayer construction produced by forming, on a transparent substrate as used in the prior art, a translucent film having electroconductivity by sputtering or vacuum evaporation and further forming thereon a thin film of a material used heretofore as a material for masks such as metallic chromium, and chromium oxide.

According to this invention in one aspect thereof, briefly summarized, there is provided a photomask blank comprising a transparent substrate, a metallic film of a translucent and electroconductive material selected from the group consisting of Nb, Ta and V, and a masking film comprising (a) a layer of metallic chromium and (b) a layer of chromium oxide superposed thereon.

According to this invention in another aspect thereof, there is provided a photomask of a general construction as described above in which the masking film is patternized.

Throughout this specification, the terms "translucent" (or "light-transmittancy" or "light-transmissive") and "masking" (or "light-screening") are intended to mean these characteristics with respect to light used in photolithography in a broad sense.

The nature, utility, and further features of this invention will be more clearly apparent from the following detailed description when read in conjunction with the accompanying drawing, briefly described below.

BRIEF DESCRIPTION OF THE DRAWINGS

In the drawing, in which

FIG. 1 indicates an intermediate step in the production of the photomask blank;

FIG. 2 shows the photomask blank;

FIGS. 3, 4, and 5 indicate intermediate steps in the production of the photomask; and FIG. 6 shows the photomask.

DETAILED DESCRIPTION OF THE INVENTION

Figure 1:
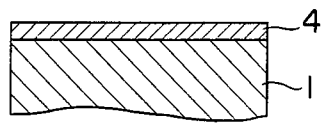
FIGS. 1 through 6 are diagrammatic, enlarged sections taken in the blank thickness direction for description of the processes of producing a photomask blank according to this invention and a photomask obtained therefrom.

The transparent substrate in the photomask blank and the photomask of this invention is made from any optically transparent material such as, for example, soda-lime glass, quartz glass, rock crystal, or sapphire. While there are essentially no limits to the thickness of this substrate, substrates of thicknesses of 0.2 to 6 mm are ordinarily used.

Next, the metallic translucent film having electroconductivity formed on the transparent substrate must be one having the property of readily transmitting light therethrough and the property of readily conducting electricity therethrough. As for its transmittancy, a film having a transmittance of 60 percent or more with respect to light of a wavelength of 200 to 550 nm, especially 400 to 550 nm, is preferable. An electrical resistivity of the film in terms of sheet resistivity of 50 K$\Omega$ per square or lower, especially 10 K$\Omega$ or lower, is desirable. Further, the thickness of this film is preferably 10 to 1000 Å and more preferably 10 to 200 Å.

It is also necessary that the adhesiveness of this film relative to the masking film of metallic chromium used in the photomask and to the glass plate be good. Another requirement is that, since the photomask is washed and repeatedly used, this film have a high chemical resistance with respect to acids, alkalis, and solvents. Still another requirement in the case where the masking film made of a substance of metallic chromium and chromium oxide is to be wet etched is that it have chemical resistance with respect also to the etching liquid.

Example of etching liquids which can be used is, for metallic chromium film and a chromium oxide film, a composition comprising
(NH$_4$)$_2$Ce(NO$_3$)$_6$: 165.0 g
HClO$_4$ (70%): 43.0 g
pure water: 1,000 ml;

In the case where dry etching is to be carried out, it is necessary that the etching gas will not attack the layer of metallic chromium and chromium oxide. Examples of etching gas which may be used e.g. in a parallel plate plasma etching apparatus is:

for metallic chromium film and or a chromium oxide film, a gaseous composition comprising CCl$_4$ and air at a pressure of 0.3 Torr (for use e.g. at a power of 200 W).

As a material for a film having the above described characteristics, a material selected from the group consisting of Nb, Ta and V is used. Among these materials, Ta is most preferable. Ordinarily, these materials are used singly, but it is possible to use mixtures of two or more thereof.

The thickness of the layer of metallic chromium for the masking film is generally in the range of 500 Å to 2000 Å and especially 600 Å to 1000 Å. Further the thickness of the layer of chromium oxide for the masking film is generally in the range of 150 Å to 400 Å and especially 200 Å to 350 Å.

Examples of production of the photomask blank and photomask of this invention will now be described with reference to the accompanying drawing.

It will be apparent from the foregoing description that the hard mask according to this invention has a durability which is superior by far to that of known hard masks and, moreover, has excellent adaptability with respect to electron-beam exposure.

EXAMPLE 1

Figure 2:
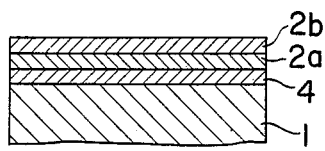

Referring first to FIG. 1, a transparent substrate of quartz glass 1 (VIOSIL-SMS' supplied by Shinetsu Kagaku K.K., Japan) which had been abraded elaborately was coated with a Ta film 4 by the sputtering process at a coat thickness of 60 Å to form a light-transmissive and electroconductive coating film. It should be mentioned that this film 4 can also be formed, in general, by a process such as vacuum evaporation or electroless plating. Then, as indicated in FIG. 2, on this Ta film, a thin Cr film 2a of a thickness of 600 Å was formed by the sputtering process, and further as a third layer a thin chromium oxide film 2b of a thickness of 300 Å was laminated thereon by the reactive sputtering process in the presence of a mixture of Ar gas and O$_2$ gas (5%) to form an anti-reflection layer. In this manner, a photomask blank was fabricated.

Figure 3:
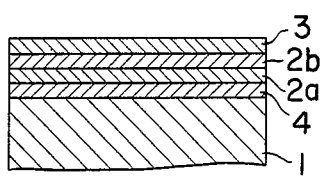
Figure 4:
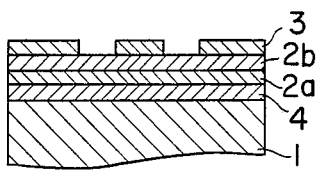
Figure 5:
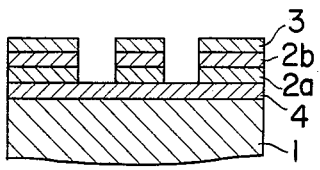
Figure 6:
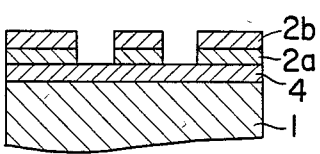

Then, on the chromium oxide film 2b of the photomask blank thus fabricated, an EB resist 3 (OEBR-100 supplied by Tokyo-Oka, Japan) of a thickness of 0.6 $\mu$m was formed as indicated in FIG. 3. After exposure to electron beam of the EB resist through a circuit pattern, the EB resist was developed by using a developer prescribed therefor thereby to obtain a resist pattern as indicated in FIG. 4. Subsequently, the thin films of Cr and chromium oxide were removed by etching with an etching solution comprising 165.0 g of (NH$_4$)$_2$Ce(NO$_3$)$_6$, 43 ml of 70% HClO$_4$ and 1,000 ml of deionized water as indicated in FIG. 5, and then the resist was removed by plasma ashing to obtain the desired electroconductive photomask (hard mask) as indicated in FIG. 6.

The optical transmittance of the light-transmissive film was 77%, and the sheet resistivity was 900 Ω/square. Further, the optical density of the light-screening film was 3.0 Hg-line g, and the surface reflectance was 12% Hg-line g.

Ten of these hard mask materials were fabricated and subjected to a durability test. In this test, pattern transfer onto a photomask blank having a silver emulsion film was carried out 100 times in an atmosphere at a temperature of 22° C. and a humidity of 40 percent. As a result, it was found that there was no occurrence of dropping off of the Cr film parts in island-like state in all ten hard mask materials, and there were also no defects whatsoever on the glass substrate surfaces without Cr films.

For comparison, ten hard mask samples of known type obtained by the procedure described above except that the light-transmissive and electroconductive film was not formed were subjected to the same test described above. As a result, dropping off of the Cr film pattern occurred in all ten samples with 10 transfers.

EXAMPLE 2

A substrate of soda-lime glass 1 which had been abraded elaborately was coated with a Nb film 4 by the electron-beam vacuum evaporation method at a coat thickness of 50 Å to form a light-transmissive and electroconductive coating film. On this Nb film 4, a thin Cr film 2a of a thickness of 500 Å was formed by the sputtering process to prepare a light-screening film, and further as a third layer a thin chromium oxide film 2b of 250 Å was laminated thereon by the reactive sputtering process to form an anti-reflection layer. In this manner, a photomask blank was fabricated.

On the photomask blank thus fabricated, a photoresist pattern was formed by well known photolithography using a photoresist 3 (AZ-1350 supplied by Shipley Co., Inc.) of a thickness of 0.5 μm. Subsequently, the thin films of Cr and chromium oxide were removed by dry etching under the conditions of plasma of CCl$_4$ and air (1:2), a pressure of 50 pa, and a power of 350 W, and then the photoresist was peeled and dissolved to obtain the desired electroconductive photomask (hard mask).

The optical transmittance of the light-transmissive film was 74%, and the sheet resistivity was 1 KΩ/square. Further, the optical density of the light-screening film was 2.8 Hg-line g, and the surface reflectance was 8% Hg-line g.

Ten of these hard mask materials were fabricated and subjected to a durability test. In this test, pattern transfer onto a photomask blank having a silver emulsion film was carried out 100 times in an atmosphere at a temperature of 22° C. and a humidity of 40 percent. As a result, it was found that there was no occurrence of dropping off of the Cr film parts in island-like state in all ten hard mask materials, and there were also no defects whatsoever on the glass substrate surfaces without Cr films.

For comparison, ten hard mask samples of known type obtained by the procedure described above except that the light-transmissive and electroconductive film was not formed were subjected to the same test described above. As a result, dropping off of the Cr film pattern occurred in all ten samples with 10 transfers.

EXAMPLE 3

A transparent glass substrate 1 (LE-30 supplied by Hoya Glass K.K., Japan) which has been abraded elaborately was coated with a V film 4 by the sputtering process at a coat thickness of 70 Å to form a light-transmissive and electroconductive coating film. On this V film 4, a thin Cr film 2a of a thickness of 650 Å was formed by the sputtering process, and further as a third layer a thin chromium oxide 2b film of a thickness of 250 Å was laminated thereon by the reactive sputtering process in the presence of a mixture of Ar gas and N$_2$ gas (90%) to form an anti-reflection layer. Thus, a photomask blank was fabricated.

On this photomask blank, a resist pattern was formed by well known photolithography using a photoresist 3 (AZ-1350 supplied by Shipley Co., Inc.) of a thickness of 0.5 μm. Thereafter, the thin films of Cr and chromium oxide were removed by etching with an etching solution comprising 165 g of (NH$_4$)$_2$Ce(NO$_3$)$_6$, 43 ml of 70% HClO$_4$ and 1,000 ml of deionized water, and then the resist was removed by dissolution to obtain the desired electroconductive photomask (hard mask).

The optical transmittance of the light-transmissive film was 65%, and the sheet resistivity was 2 KΩ/square. Further, the optical density of the light-screening film was 3.2 Hg-line g, and the surface reflectance was 20% Hg-line g.

Ten of these hard mask materials were fabricated and subjected to a durability test. In this test, pattern transfer onto a photomask blank having a silver emulsion film was carried out 100 times in an atmosphere at a temperature of 22° C. and a humidity of 40 percent. As a result, it was found that there was no occurrence of dropping off of the Cr film parts in island-like state in all ten hard mask materials, and there were also no defects whatsoever on the glass substrate surfaces without Cr films.

For comparison, ten hard mask samples of known type obtained by the procedure described above except that the light-transmissive and electroconductive film was not formed were subjected to the same test described above. As a result, dropping off of the Cr film pattern occurred in all ten samples with 10 transfers.

What is claimed is:

1. A photomask consisting essentially of: a transparent substrate, a metallic film of a translucent and electroconductive material selected from the group consisting of Nb, Ta and V formed on the substrate, and a masking film consisting essentially of (a) a layer of metallic chromium and (b) a layer of chromium oxide superposed thereon.

2. The photomask blank according to claim 1, wherein said metallic film has a transmittance of at least 60 percent with respect to light of a wavelength of 400 to 550 nm and a sheet resistivity of at most 50 KΩ per square and has a thickness of 10 to 200 Å.

3. A photomask consisting essentially of: a transparent substrate, a metallic film of a translucent and electroconductive material selected from the group consisting of Nb, Ta and V and a patternized masking film consisting essentially of (a) a layer of metallic chromium and (b) a layer of chromium oxide thereon.

4. The photomask according to claim 3, wherein said metallic film has a transmittance of at least 60 percent with respect to light of a wavelength of 400 to 550 nm and a sheet resistivity of at most 50 KΩ per square and has a thickness of 10 to 200 Å.

5. The photomask according to claim 3, wherein said masking film is patternized by etching, and said metallic film is substantially inert to etchants.

6. The photomask according to claim 3, wherein said masking film includes parts in the state of islands isolated from other parts of the same film.

* * * * *